US012647086B2

(12) United States Patent
Shi et al.

(10) Patent No.: US 12,647,086 B2
(45) Date of Patent: Jun. 2, 2026

(54) BULK ACOUSTIC WAVE RESONATOR AND CAPACITOR WITH SILICON SUPPORT

(71) Applicant: SKYWORKS SOLUTIONS, INC., Irvine, CA (US)

(72) Inventors: Lisha Shi, San Jose, CA (US); David Albert Feld, Los Altos, CA (US); Alexandre Augusto Shirakawa, Cardiff by the Sea, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 740 days.

(21) Appl. No.: 18/147,202

(22) Filed: Dec. 28, 2022

(65) Prior Publication Data

US 2023/0216462 A1      Jul. 6, 2023

Related U.S. Application Data

(60) Provisional application No. 63/266,179, filed on Dec. 30, 2021.

(51) Int. Cl.
  *H03H 3/04* (2006.01)
  *H03H 9/02* (2006.01)
(52) U.S. Cl.
  CPC .......... *H03H 3/04* (2013.01); *H03H 9/02015* (2013.01); *H03H 2003/0435* (2013.01)
(58) Field of Classification Search
  CPC ................. H03H 3/04; H03H 9/02015; H03H 2003/0435; H03H 3/02; H03H 9/542
  See application file for complete search history.

(56) References Cited

U.S. PATENT DOCUMENTS

| | | | | |
|---|---|---|---|---|
| 10,886,888 | B2 | 1/2021 | Ivira et al. | |
| 12,267,065 | B2 * | 4/2025 | Liu | H03F 3/195 |
| 12,289,097 | B2 * | 4/2025 | Liu | H03H 9/1014 |
| 12,388,410 | B2 * | 8/2025 | Iwamoto | H03H 9/02015 |
| 2022/0321095 | A1 * | 10/2022 | Liu | H03H 9/173 |
| 2022/0321100 | A1 * | 10/2022 | Liu | H03F 1/56 |
| 2022/0321101 | A1 * | 10/2022 | Liu | H03F 3/195 |
| 2023/0123285 | A1 * | 4/2023 | Goto | H03H 9/568 |
| | | | | 310/311 |

(Continued)

FOREIGN PATENT DOCUMENTS

EP          1998444 A2 * 12/2008 ............. H03H 9/589

*Primary Examiner* — Pedro J Cuevas
(74) *Attorney, Agent, or Firm* — Lando & Anastasi, LLP

(57) ABSTRACT

An acoustic wave device is provided comprising a substrate and at least one resonator structure of a first type and at least one resonator structure of a second type mounted on the substrate. The resonator structures of the first type are configured to operate as capacitors and have a first thickness, causing the resonator structures to have a first passband frequency range. The resonator structures of the second type have a second thickness that is different from the first thickness, causing the resonator structures to have a second passband frequency range. A method for forming such an acoustic wave device is also provided. A die comprising such an acoustic wave device, a filter comprising such an acoustic wave device, a radio-frequency module comprising such an acoustic wave device, and a wireless mobile device comprising such an acoustic wave device are also provided.

20 Claims, 21 Drawing Sheets

(56)        References Cited

U.S. PATENT DOCUMENTS

| 2023/0124493 | A1* | 4/2023 | Shin | H03H 9/173 |
| | | | | 333/187 |
| 2023/0216478 | A1 | 7/2023 | Caron et al. | |
| 2024/0243722 | A1 | 7/2024 | Shin et al. | |
| 2025/0219615 | A1* | 7/2025 | Abbott | H03H 9/132 |
| 2025/0323625 | A1* | 10/2025 | Liu | H03H 9/02228 |
| 2025/0392284 | A1* | 12/2025 | Liu | H03H 9/178 |
| 2026/0005673 | A1* | 1/2026 | He | H03H 9/568 |

* cited by examiner

─1400

1402

PROVIDING A SUBSTRATE

1404

FORMING AT LEAST ONE RESONATOR
STRUCTURE OF A FIRST TYPE

1406

FORMING AT LEAST ONE RESONATOR
STRUCTURE OF A SECOND TYPE

BULK ACOUSTIC WAVE RESONATOR AND CAPACITOR WITH SILICON SUPPORT

CROSS-REFERENCE TO RELATED APPLICATIONS

This application claims priority under 35 U.S.C. § 119(e) to U.S. Provisional Patent Application Ser. No. 63/266,179, titled "BULK ACOUSTIC WAVE RESONATOR/CAPACITOR WITH SILICON SUPPORT," filed Dec. 30, 2021, the entire contents of which is incorporated by reference herein for all purposes.

BACKGROUND

Field

The present disclosure generally relates to acoustic wave devices, and particularly to bulk acoustic wave devices.

Description of Related Art

For a wideband RF Bandpass filter to have steep passband edges, resonators comprising the filter may have independently adjustable frequencies, impedances, and coupling coefficients. Such filters may be fabricated en-mass using any suitable process, such as an on-wafer bulk acoustic wave (BAW) microfabrication process, and then be singulated into individual filters. Implementing such a process for fabricating filters having independently adjustable frequencies and impedances may be relatively easily implemented by, for example, controlling the layer thicknesses and areas of each resonator. Enabling coupling coefficients of each resonator to be independently adjustable may involve having on-die capacitors electrically in parallel with particular resonators comprising the filter.

The aforementioned capacitors can be implemented in the form of surface-mounted devices (SMDs) or other off-die components. However, doing so significantly increases the total module area, the number of input/output pins, and routing complexity on the filter die.

Alternatively, metal-insulator-metal (MIM) or metal-oxide-metal (MOM) capacitors could be integrated into a BAW wafer process to serve as capacitors. However, doing so would add additional processing steps for depositing a reliable, controllable, and pin-hole-free oxide or insulator layer. Such additional process steps would increase cost and complexity of the fabrication process.

SUMMARY

According to a number of embodiments, the present disclosure relates to an acoustic wave device comprising a substrate, at least one resonator structure of a first type, and at least one resonator structure of a second type mounted on the substrate. Each of the resonator structures of the first and second types comprises a first electrode, a second electrode, and a piezoelectric layer. The piezoelectric layer is located between the first electrode and the second electrode. The second electrode is located between the piezoelectric layer and the substrate. The resonator structures of the first type are configured to operate as capacitors and have a first thickness, causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$.

In some embodiments, the first and second passband frequency ranges are non-overlapping with each other.

In some embodiments, the first electrodes of the resonator structures of the first type and the first electrodes of the resonator structures of the second type have different thicknesses.

In some embodiments, the second electrodes of the resonator structures of the first type and the second electrodes of the resonator structures of the second type have different thicknesses.

In some embodiments, the first anti-resonant frequency, $f_{p1}$ is smaller than the second resonant frequency, $f_{s2}$.

In some embodiments, the first anti-resonant frequency, $f_{p1}$ and the second resonant frequency, $f_{s2}$, are separated by an amount such that at least one resonance originating from the resonator structures of the first type is minimized in the second passband frequency.

In some embodiments, the first anti-resonant frequency, $f_{p1}$ and the second resonant frequency, $f_{s2}$, are separated by at least $f_{p1}$-$f_{s1}$.

In some embodiments, the first anti-resonant frequency, $f_{p1}$ and the second resonant frequency, $f_{s2}$, are separated by at least $f_{p2}$-$f_{s2}$.

In some embodiments, the acoustic wave device further comprises an air cavity located between the substrate and each of the resonator structures of the first type, and at least one support member supporting each of the resonator structures of the first type, the support members being located in the air cavities.

In some embodiments, the substrate has a portion having a first thickness, $T_1$, and a portion having a second thickness, $T_2$, the second thickness being greater than the first thickness, to define the air cavity.

In some embodiments, at least one of the support members is located on the portion of the substrate having the first thickness, $T_1$.

In some embodiments, the second thickness, $T_2$, of the substrate is equal to $T_2$=$T_1$+$T_s$, $T_s$ being a height of one of the support members.

In some embodiments, the portion of the substrate having the second thickness, $T_2$, includes at least one opening, the opening connecting the air cavity to an outside of the acoustic wave device.

In some embodiments, at least a portion of at least one of the resonator structures of the first type is supported by the portion of the substrate having the second thickness, $T_2$.

In some embodiments, an edge of at least one of the resonator structures of the first type is supported by the portion of the substrate having the second thickness $T_2$.

In some embodiments, at least one of the support members is located entirely within the air cavity.

In some embodiments, at least one of the support members is a pillar.

In some embodiments, the support members are positioned symmetrically about an axis passing through a center of the air gap.

In some embodiments, at least one of the support members is approximately in a form of one of a cuboid, a cube, a cylinder, an elliptic cylinder, a prism, or a ring.

In some embodiments, the first and/or second electrode of at least one of the resonator structures of the first type has a reduced thickness over the portions of the resonator structures of the first type supported by the at least one support member.

In some embodiments, the piezoelectric layer of at least one of the resonator structures of the first type is not covered by the first and/or second electrode(s) over the portions of the resonator structures of the first type supported by the at least one support member.

In some embodiments, at least one of the support members and the substrate are made of a same material.

In some embodiments, at least one of the resonator structures of the first type includes at least one opening, the opening connecting the air cavity to an outside of the acoustic wave device.

In some embodiments, at least one of the resonator structures of the first type includes at least one frame structure having at least one frame.

In some embodiments, the at least one frame includes one or more of metal, silicon dioxide ($SiO_2$), silicon nitride (SiN), and/or silicon carbide (SiC).

In some embodiments, the at least one frame is disposed along an edge of at least one of the resonator structures of the first type.

In some embodiments, the at least one frame is disposed between one or more of the support members and at least one of the resonator structures of the first type.

In some embodiments, the at least one frame is disposed between the substrate and at least one of the resonator structures of the first type.

In some embodiments, the air cavity is configured to separate at least one of the resonator structures of the first type away from at least a part of the substrate, thereby preventing one or more acoustic wave(s) from at least one of the resonator structures of the first type from propagating into the substrate.

In some embodiments, the substrate comprises silicon.

In some embodiments, at least one of the resonator structures of the first type is approximately in a form of one of a polygon, a circle, or an oval.

In some embodiments, each of the first and/or second electrodes of at least one of the resonator structures of the first type includes a first metal layer and at least one additional metal layer adjacent to the first metal layer, thereby lowering a resonant frequency of the acoustic wave device.

In some embodiments, the acoustic wave device is a bulk acoustic wave (BAW) device.

According to a number of embodiments, the present disclosure relates to a die comprising an acoustic wave device, the acoustic wave device comprising a substrate, at least one resonator structure of a first type, and at least one resonator structure of a second type mounted on the substrate. Each of the resonator structures of the first and second types comprises a first electrode, a second electrode, and a piezoelectric layer. The piezoelectric layer is located between the first electrode and the second electrode. The second electrode is located between the piezoelectric layer and the substrate. The resonator structures of the first type are configured to operate as capacitors and have a first thickness, causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$.

According to a number of embodiments, the present disclosure relates to a filter comprising one or more acoustic wave devices, each acoustic wave device comprising a substrate, at least one resonator structure of a first type, and at least one resonator structure of a second type mounted on the substrate. Each of the resonator structures of the first and second types comprises a first electrode, a second electrode, and a piezoelectric layer. The piezoelectric layer is located between the first electrode and the second electrode. The second electrode is located between the piezoelectric layer and the substrate. The resonator structures of the first type are configured to operate as capacitors and have a first thickness, causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$.

According to a number of embodiments, the present disclosure relates to a radio-frequency module comprising a packaging substrate configured to receive a plurality of devices, and a die mounted on the packaging substrate, the die having an acoustic wave device. The acoustic wave device comprises a filter comprising one or more acoustic wave devices, each acoustic wave device comprising a substrate, at least one resonator structure of a first type, and at least one resonator structure of a second type mounted on the substrate. Each of the resonator structures of the first and second types comprises a first electrode, a second electrode, and a piezoelectric layer. The piezoelectric layer is located between the first electrode and the second electrode. The second electrode is located between the piezoelectric layer and the substrate. The resonator structures of the first type are configured to operate as capacitors and have a first thickness, causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$.

According to a number of embodiments, the present disclosure relates to a wireless mobile device comprising one or more antennas and a radio-frequency module that communicates with the one or more antennas, the radio-frequency module comprising a packaging substrate configured to receive a plurality of devices and a die mounted on the packaging substrate, the die having an acoustic wave device, the acoustic wave device comprising a substrate, at least one resonator structure of a first type, and at least one resonator structure of a second type mounted on the substrate. Each of the resonator structures of the first and second types comprises a first electrode, a second electrode, and a piezoelectric layer. The piezoelectric layer is located between the first electrode and the second electrode. The second electrode is located between the piezoelectric layer and the substrate. The resonator structures of the first type are configured to operate as capacitors and have a first thickness, causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$.

According to a number of embodiments, the present disclosure relates to a method for forming an acoustic wave device comprising providing a substrate and forming at least one resonator structure of a first type and at least one resonator structure of a second type on the substrate. Each of the resonator structures of the first and second types comprises a first electrode, a second electrode, and a piezoelectric layer. The piezoelectric layer is located between the first electrode and the second electrode. The second electrode is located between the piezoelectric layer and the substrate. The resonator structures of the first type have a first thickness causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$.

In some embodiments, the thickness of at least one of the first and second electrodes of the resonator structures of the first type is determined so as to shift the first passband frequency range away from the second passband frequency range.

In some embodiments, the method includes forming the first electrode of the resonator structures of the first type and the first electrode of the resonator structures of the second type with different thicknesses.

In some embodiments, the method includes forming the second electrodes of the resonator structures of the first type and the second electrodes of the resonator structures of the second type with different thicknesses.

In some embodiments, the first anti-resonant frequency, $f_{p1}$ is smaller than the second resonant frequency, $f_{s2}$.

In some embodiments, the first anti-resonant frequency, $f_{p1}$ and the second resonant frequency, $f_{s2}$, are separated by an amount such that at least one resonance originating from the resonator structures of the first type is minimized in the second passband frequency.

In some embodiments, the first anti-resonant frequency, $f_{p1}$ and the second resonant frequency, $f_{s2}$, are separated by at least $f_{p1}$-$f_{s1}$.

In some embodiments, the first anti-resonant frequency, $f_{p1}$ and the second resonant frequency, $f_{s2}$, are separated by at least $f_{p2}$-$f_{s2}$.

Embodiments disclosed herein may address various problems. One or more embodiments may address one or more of the problems concerning providing on-die capacitors for enabling coupling coefficients of each resonator in a filter to be independently adjustable or utilising a resonator to function as a capacitor (RESCAP) as well as a resonator.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
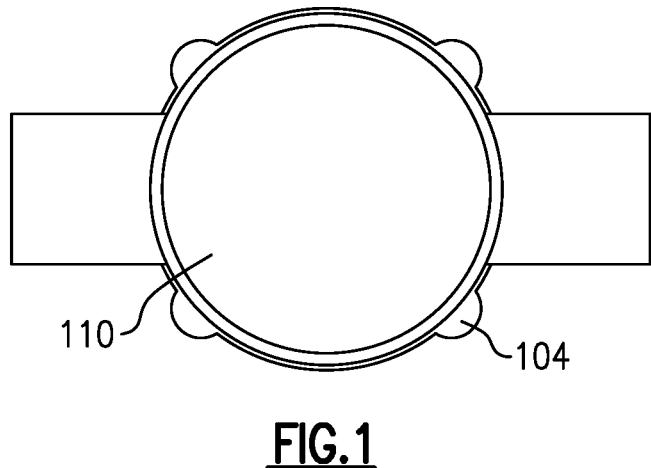
FIG. 1 is a top view of a section of an acoustic wave device comprising a substrate, a resonator structure of a first type configured to operate as a capacitor having a piezoelectric layer between a first electrode and a second electrode, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Generally embodiments of the invention may provide an acoustic wave device comprising a substrate, at least one resonator structure of a first type, and at least one resonator structure of a second type mounted on the substrate. Each of the resonator structures of the first and second types comprise a first electrode, a second electrode, and a piezoelectric layer. The piezoelectric layer is located between the first electrode and the second electrode. The second electrode is located between the piezoelectric layer and the substrate. The resonator structures of the first type are configured to operate as capacitors and have a first thickness causing the resonator structures to have a first passband frequency range between a first resonant frequency, $f_{s1}$, and a first anti-resonant frequency, $f_{p1}$. The resonator structures of the second type have a second thickness that is different from the first thickness, causing the resonator structures to have a second passband frequency range between a second resonant frequency, $f_{s2}$, and a second anti-resonant frequency, $f_{p2}$. Components and devices comprising such an acoustic wave device are also provided.

On-die capacitors for enabling coupling coefficients of each resonator in a filter to be independently adjustable may be provided by including additional resonators of a suitable type in the filter and using the additional resonators as capacitors. One example of resonators of a suitable type may be bulk acoustic wave resonators (BAWs). BAWs typically comprise top and bottom electrodes separated by a layer, such as a piezoelectric layer, located between the electrodes. Top and bottom electrodes in BAW resonators may function as parallel conductive plates that would be seen in a typical parallel-plate capacitor, therefore BAW resonators may also function as capacitors (RESCAPs).

As used herein, the term "RESCAP" means a resonator structure configured to serve, or to function, as a capacitor. A RESCAP may also be configured to serve as both a capacitor and resonator when desired.

A RESCAP may be electrically connected with at least one resonator that is configured to serve as a resonator. The connection between the RESCAP and the resonator may be in parallel. The connection of the RESCAP to the resonator enables the coupling coefficient of the resonator to be adjustable.

Figure 12A:
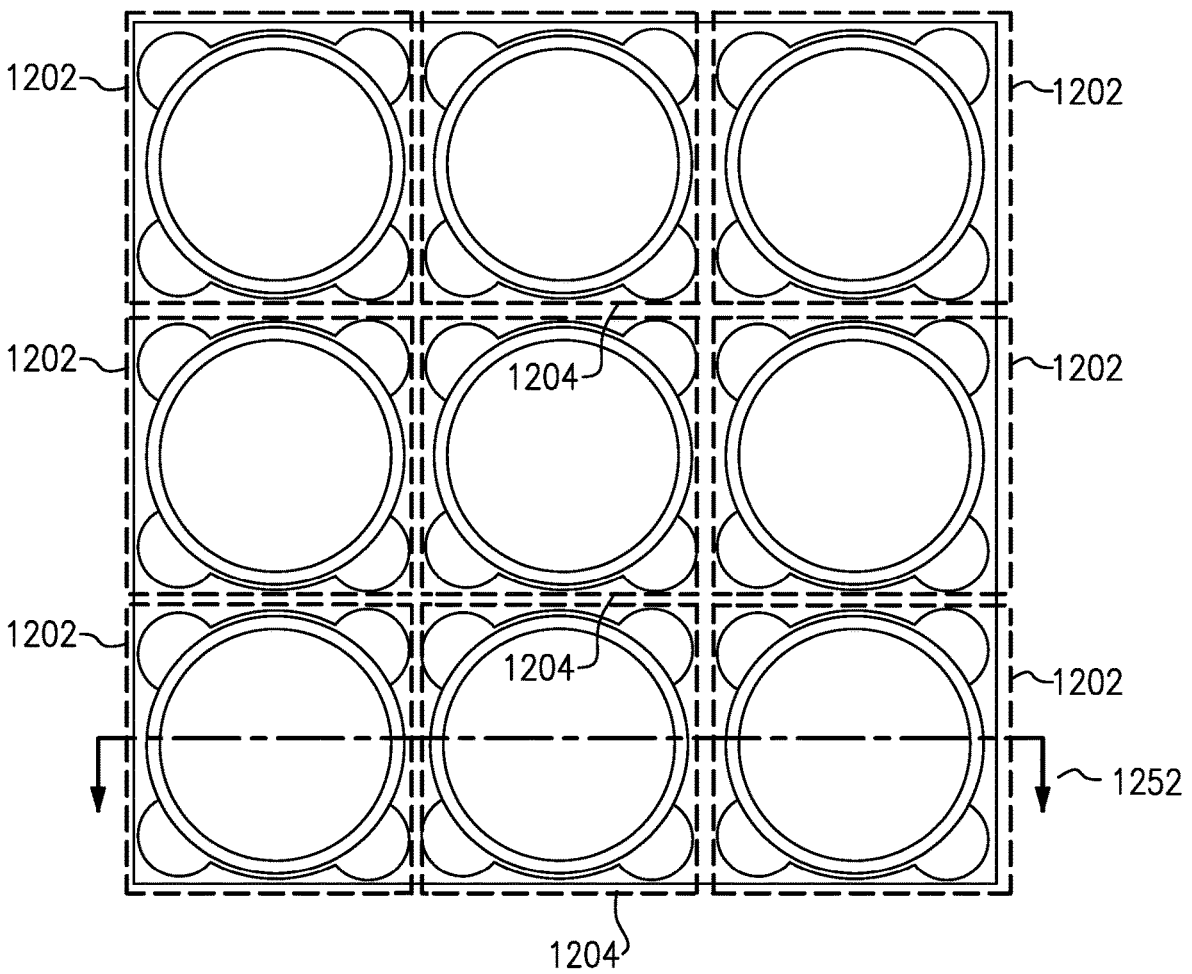
FIG. 12A is a top view of an acoustic wave device comprising sections having resonators of a first type and sections having resonators of a second type, according to an embodiment.
Figure 12B:
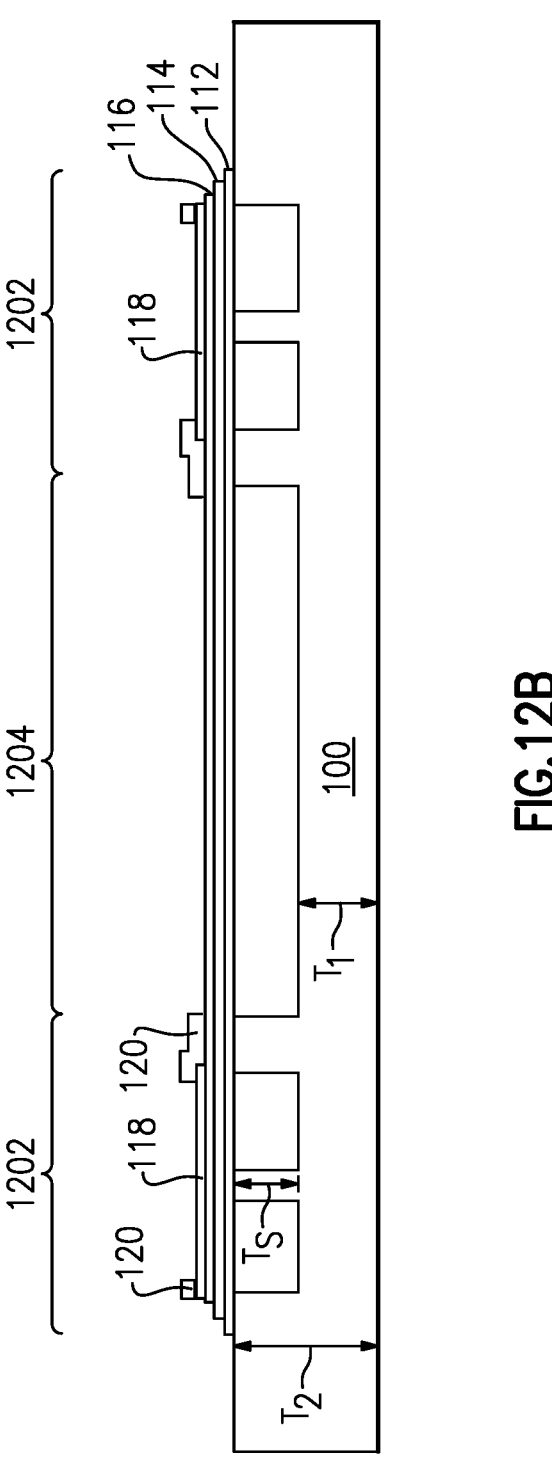
FIG. 12B is a cross-sectional view of an acoustic wave device comprising sections having a resonator of a first type and sections having a resonator of a second type, according to an embodiment.

FIG. 12A illustrates a top view of an exemplary acoustic wave device comprising at least one first section (1202) having a RESCAP and at least one section (1204) having a resonator. FIG. 12B is a cross-sectional view of the acoustic wave device according to the example shown in FIG. 12A, showing a cross-section along a cross-section line (1252). As shown in FIG. 12B, the RESCAPs and resonators may comprise one of more shared part(s) and/or layer(s), such as electrodes (112, 116) and a piezoelectric layer (114). Optionally, such shared part(s) and/or layer(s) may be formed using the same deposition, growth, and/or fabrication technique(s). Optionally, such shared part(s) and/or layer(s) of the RESCAP and resonator may be formed simultaneously.

Although the RESCAPs and resonators shown in FIG. 12A have identical shapes and dimensions, the acoustic wave device may comprise RESCAPs and resonators having a plurality of different shapes and dimensions depending on factors, including the shape and dimensions of the acoustic wave device, physical space available for the resonator structures in and/or on the acoustic wave device, and desired acoustic and electrical properties of the acoustic wave device.

Figure 12C:
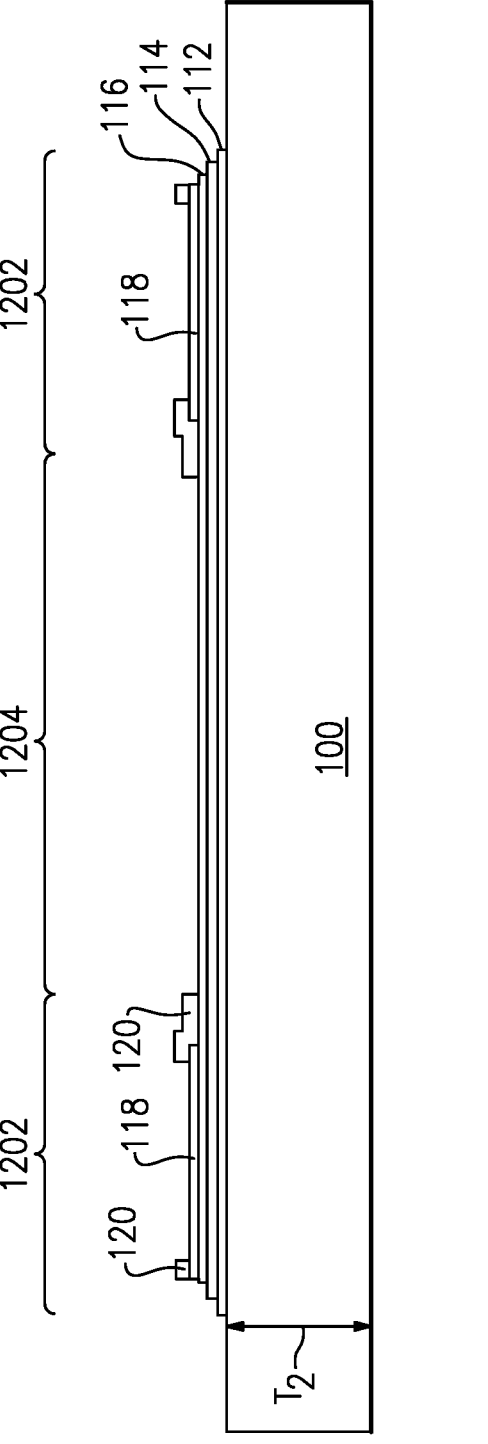
FIG. 12C is a cross-sectional view of an acoustic wave device comprising sections having a resonator of a first type and sections having a resonator of a second type, according to an embodiment.

Furthermore, the example acoustic wave device shown in FIG. 12B comprises air cavities between the RESCAPs and the substrate (100), and also air cavities between the resonator and the substrate (100). Such air cavities are optional features. In other embodiments, the air cavities may be located only between the RESCAPs and the substrate (100), or only between the resonator and the substrate (100). In still other embodiments, the acoustic wave device may comprise no air cavity, as shown in FIG. 12C.

Although such a RESCAP structure may be used in a filter as a capacitor without structural modification, it may be beneficial to make one or more structural modification(s) to shift the resonant frequency of the RESCAP away from the resonant frequency of the passband frequencies of the filter.

For example, a RESCAP may comprise at least one electrode having a greater thickness than that of other similar resonators in a filter. Alternatively, a RESCAP may comprise at least one additional layer, for example, an additional metal layer. Any of the abovementioned modifications may shift a resonant frequency of a RESCAP below the passband frequencies of a filter in which the RESCAP and other resonator(s) are included. Therefore, such a RESCAP having an additional metal layer and/or a thicker electrode has negligible acoustic effect at passband frequencies. In other words, the resulting RESCAP structure may be effectively non-resonant at such passband frequencies and may function as a capacitor.

Such modifications may be relatively easily implemented as they require minimal changes to existing fabrication processes for forming resonators and no change to existing fabrication facilities. The fabrication processes and facilities for forming resonators and RESCAPs may also be integrated.

Embodiments of the acoustic wave device will be discussed with reference to example top-view and cross-sectional figures. FIGS. 1 to FIG. 8 illustrate examples of sections of the acoustic devices comprising a RESCAP structure. Any features of the acoustic devices of FIGS. 1 to FIG. 8 may be combined with each other. Although the RESCAP structures illustrated in the examples of FIGS. 1 to FIG. 8 are RESCAPs resembling BAW resonators, any type of resonator structure that is suitable to function as a capacitor may be used. Furthermore, the acoustic devices illustrated in the examples of FIGS. 1 to FIG. 8 comprise a RESCAP structure, but any other type of structure having a first electrode, a second electrode, and a piezoelectric layer located between the first and second electrodes may be used.

FIG. 1 is a top view of an acoustic wave device comprising a substrate, a resonator structure of a first type (110), and an air cavity. The resonator structure of the first type (110) may comprise a first electrode, a second electrode, and a piezoelectric layer. The piezoelectric layer of the resonator structure of the first type (110) may be located between the first electrode and the second electrode. The second electrode may be located between the piezoelectric layer and the substrate. The resonator structure of the first type (110) may be or may comprise a RESCAP. The air cavity may be located between the substrate and the resonator structure of the first type (110). Optionally the substrate may comprise silicon. The resonator structure of the first type (110) of the example shown in FIG. 1 is approximately circular. However, in other embodiments, the resonator structure of the first type (110) may be in any other form, such as an approximately polygonal or an oval form.

As the resonator structure of the first type (110) may function as a resonator and/or comprise a resonator, it may be desirable to be able to control a resonant frequency of the resonator structure of the first type (110). This may be particularly important if the resonator structure of the first type (110) forms a part of an acoustic wave device or structure, such as a filter.

For example, the acoustic wave devices shown in FIGS. 12A to FIG. 12C comprise at least one resonator structure of the first type (110) and at least one resonator structure of the second type which are configured to operate as resonators. In such an acoustic wave device, a frequency band of interest is determined by a passband of the resonator structure of the second type. However, as the resonator structures of the first type (110) are also able to operate as resonators, a resonance from the resonator structures of the first type (110) may occur within or near a frequency band of interest of the acoustic wave device. In such instances, it may be beneficial to shift the resonant frequency of the resonator structure of the first type (110) away from the passband frequencies of the acoustic wave device or structure.

Figure 13:
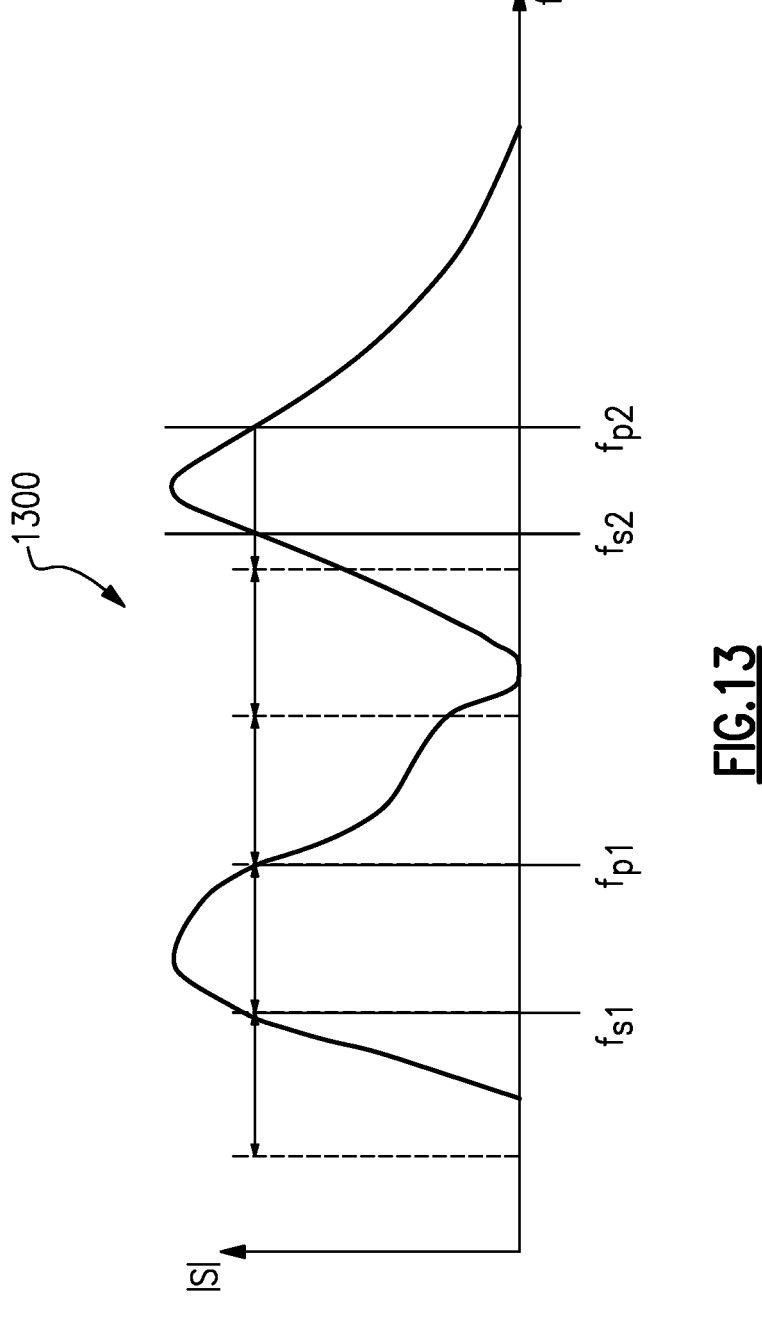
FIG. 13 is a graph showing example S-parameter (|S|)-frequency response in an embodiment comprising resonators of a first type and resonators of a second type.
Figure 14:
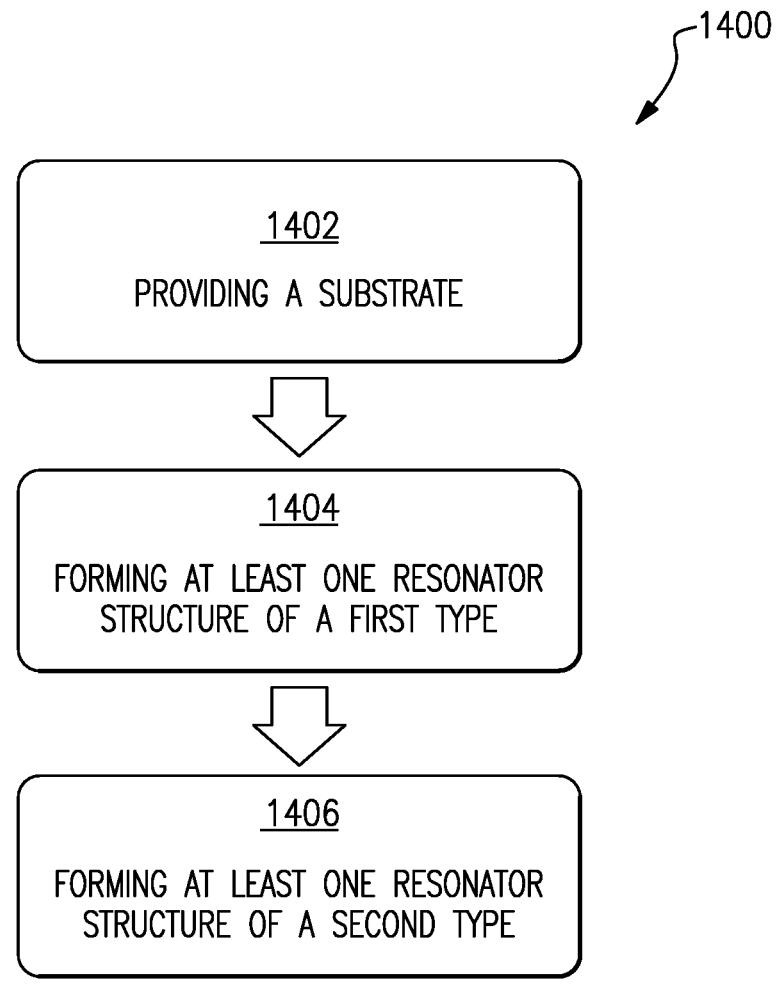
FIG. 14 is a flow diagram showing steps for forming an acoustic wave device according to an embodiment.

FIG. 13 is a graph illustrating an exemplary frequency response of the acoustic wave device after such shifting. In the example of FIG. 13, the resonator structures of the first type have a first thickness, causing the resonator structures to have a first passband frequency range between a first resonant frequency, $f_{s1}$, and a first anti-resonant frequency, $f_{p1}$. On the other hand, the resonator structures of the second type have a second thickness that is different from the first thickness, causing the resonator structures to have a second passband frequency range between a second resonant frequency, $f_{s2}$, and a second anti-resonant frequency, $f_{p2}$. As illustrated in FIG. 13, the first and second passband frequency ranges may be non-overlapping to prevent a resonance originating from the resonator structure of the first type from occurring within a frequency band of interest of the acoustic device. To ensure that the first and second passband frequency ranges do not overlap, the first passband may be shifted so that the first anti-resonant frequency, $f_{p1}$ is smaller than the second resonant frequency, $f_{s2}$. Optionally, the first anti-resonant frequency, $f_{p1}$ and the second resonant frequency, $f_{s2}$, may be separated by at least $f_{p1}$-$f_{s1}$ to improve the separation between the first and second passband frequency ranges. Alternatively, the first anti-resonant frequency, $f_{p1}$ and the second resonant frequency, $f_{s2}$, may be separated by at least $f_{p2}$-$f_{s2}$.

Such shifting of the resonant frequency may be achieved by introducing at least one additional conductive layer on at least one of the first and second electrodes of the resonator structure of the first type, and/or by controlling the thickness of at least one of the first and second electrodes of the resonator structure of the first type. Therefore, at least one of the first electrode and a second electrode of the acoustic wave device may comprise at least one additional conductive layer, such as a metal layer, formed thereon. Optionally, the first electrode may have a greater thickness than the second electrode. Alternatively, the second electrode may have a greater thickness than the second electrode. The resonator structure of the first type (110) may be separated away from at least a part of the substrate to prevent acoustic wave(s) from the resonator structure of the first type (110) from propagating into the substrate and/or other structures attached to the substrate. This may be particularly useful if the resonator structure of the first type (110) forms a part of another acoustic wave device or structure, such as a filter, having passband frequencies overlapping with or near the resonant frequency of the resonator structure of the first type. Such a separation between the resonator structure of the first type (110) and at least a part of the substrate may be achieved by the air cavity.

Alternatively, at least one or more acoustic reflectors, such as a Bragg reflector, may be introduced between the resonator structure of the first type and at least a part of the substrate to reduce wave propagation from the resonator structure of the first type (110) into the substrate and/or other structures attached to the substrate.

The air cavity may be formed after the resonator structure of the first type is attached or deposited on the substrate. In such implementations the air cavity may be formed between the resonator structure of the first type (110) and the substrate by removing at least a portion of the substrate. The removal of at least a portion of the substrate may be performed by any removal technique, such as etching or milling, suitable for removing at least one material of which the substrate is comprised. As removing at least a portion of the substrate may require access to at least a portion of the substrate covered by the resonator structure of the first type (110), at least one opening (104) may be formed on the resonator structure of the first type (110) and/or on the substrate. Such opening(s) (104) may be in the form of release hole(s). Such opening(s) (104) may connect the outside of the acoustic wave device to at least a portion of the substrate covered by the resonator structure of the first type (110), thereby allowing the removal of at least a portion of the substrate to be performed more easily. As a result of the removal of at least a portion of the substrate, an air cavity may be formed between the substrate and the resonator structure of the first type (110). At least one of the opening(s) (104) may connect the air cavity to the outside of the acoustic wave device. The acoustic wave device may comprise the opening(s) (104) for other purpose(s), for example, to optimize at least one electrical, mechanical, and/or acoustic performance(s) of the acoustic wave device or structure, such as a filter.

Alternatively, the air cavity may be formed before the resonator structure of the first type is attached or deposited on the substrate. In such implementations, the acoustic wave device may not comprise the opening(s) (104).

The substrate may have a portion having a first thickness, $T_1$, and a portion having a second thickness, $T_2$, the second thickness $T_2$ being greater than the first thickness $T_1$ (See FIG. 12B). In such implementations, the air cavity is located between the portion of the substrate (100) having the first thickness, $T_1$ and a surface the resonator structure of the first type (110). In such implementations, at least a portion of the resonator structure of the first type (110) may be supported away from the portion of the substrate having the first thickness, $T_1$, by the portion of the substrate having the second thickness, $T_2$. In such implementations, a height of the air gap may be equal to a distance between the resonator structure of the first type (110) and the portion of the substrate having the first thickness, $T_1$, therefore the height of the air gap may be equal to the difference between $T_2$ and $T_1$, $T_2$-$T_1$. Optionally, at least one edge of the resonator structure of the first type (110) may be supported by the portion of the substrate having the second thickness $T_2$.

Figure 2A:
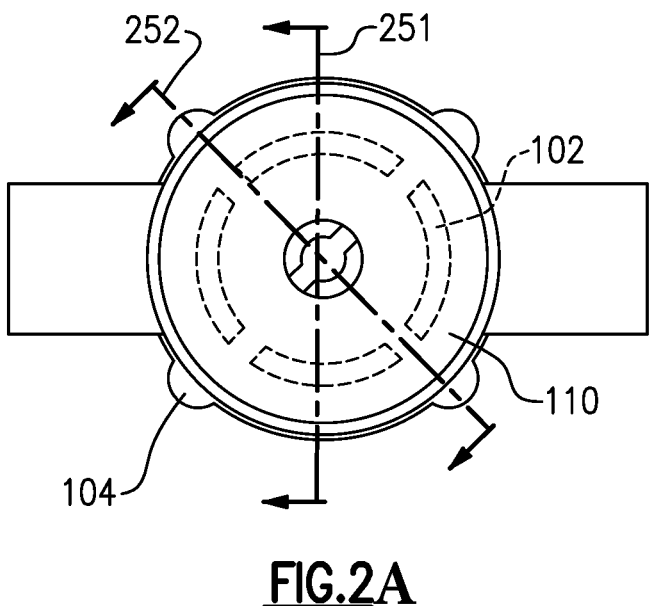
FIG. 2A is a top view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIG. 2A is a top view of a section of an acoustic wave device comprising a substrate (100), a resonator structure of the first type (110), an air cavity, and at least one support member (102) according to an embodiment. The section of the acoustic wave device in FIG. 2A is similar to the section of the acoustic wave device of FIG. 1, except that the resonator structure of the first type (110) of the example shown in FIG. 2A is supported by support member(s) (102). At least one of the support member(s) (102) may be located between the substrate (100) and the resonator structure of the first type (110). At least one of the support members is located within the air cavity. Although in the resonator structure of the first type (110) of the example shown in FIG. 2A the support members (102) are made of the same material as the substrate, both being made of silicon, for example, the support members (102) of the resonator structure of the first type (110) may be made of any suitable material(s) to support the resonator structure of the first type (110) away from the substrate (100).

Figure 2B:
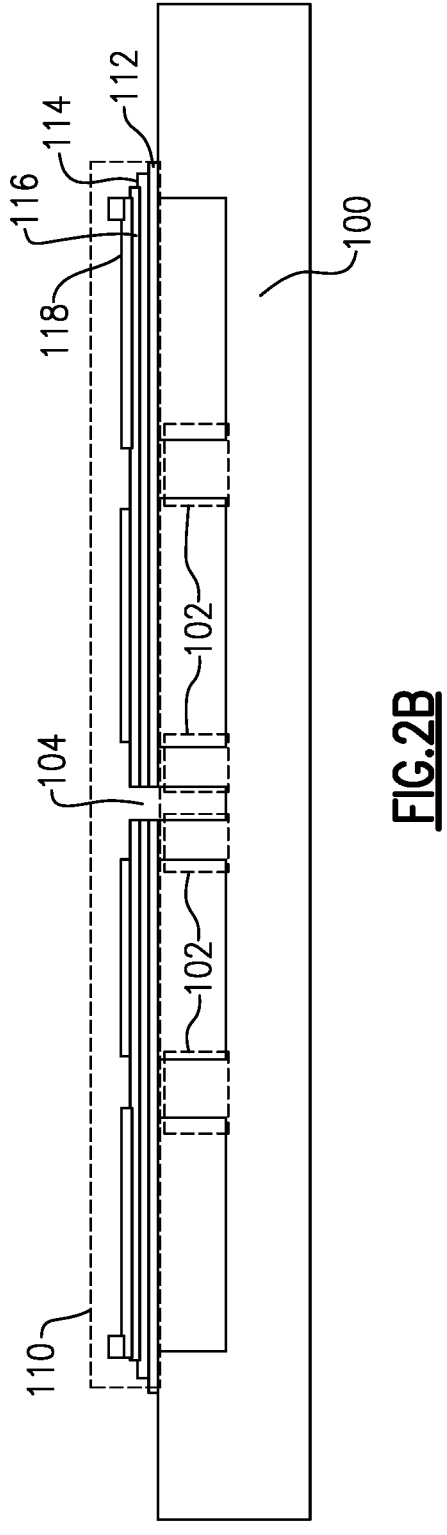
FIG. 2B is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIG. 2B, is a cross-sectional view of a section of the acoustic wave device according to the example shown in FIG. 2A, showing a cross-section along a first cross-section line (251). The support member(s) (102) may provide structural stability to the acoustic device by supporting the resonator structure of the first type (110) away from the substrate (100). The resonator structure of the first type (110), therefore, may be supported by the portion of the substrate (100) having the second thickness, $T_2$ and/or at least one of the support member(s) (102). Having such support member(s) (102) may be particularly useful if the resonator structure of the first type (110) has a large area, comprises a heavy material and/or is prone to structural damage, such as bowing and cracking. For example, if the resonator structure of the first type (110) is a RESCAP comprising a relatively thick layer of electrode and/or a RESCAP having an additional metal layer, having at least one support member(s) located within the air cavity and supporting the resonator structure of the first type (110) at a central and/or middle portion thereof, supporting the resonator structure of the first type (110) away from the substrate (100), may prevent the RESCAP resonator structure of the first type (110) from bowing and/or cracking.

The support member(s) (102) may be located on the portion of the substrate (100) having the first thickness, $T_1$. At least one of the support member(s) (102) may be located entirely within the air cavity. In such implementations, the height, $T_s$ (See FIG. 12B), of the support member(s) (102) located entirely within the air cavity may be equal to $T_s$=$T_2$-$T_1$. Each of the support member(s) (102) may have the same or different shape and dimensions. At least one of the support member(s) (102) may be in the form of pillar. Optionally, all of the support member(s) (102) may be in forms of support pillars. As shown in the example of FIG. 2A, a section of the acoustic wave device may comprise a plurality of support pillars having different shapes and dimensions. The support member(s) (102) may be approximately in the form of one of: a cuboid, a cube, a cylinder, an elliptic cylinder, a prism, or a ring. Optionally, some of the support member(s) (102) may collectively and/or individually be formed into a support structure shape. For example, at least a subset of the support members may together form a ring, ellipse, polygon, or an equivalent broken shape. The support members may form a type of shape that is similar to a shape defined by the perimeter of the resonator structure of the first type (110). In the example of FIG. 2A, the support member(s) (102) collectively form two broken circular shapes, each of the circular shapes being similar to the circular shape of the perimeter of the resonator structure of the first type (110). As shown in the example of FIG. 2A, the support pillars may have elongated and curved shapes. The support member(s) (102) may be distributed on the substrate (100) symmetrically about an axis passing through the center of the air cavity.

Shape(s), dimension(s), and/or distribution of the support member(s) (102) may be determined in a way to optimize at least one electrical, mechanical, and/or acoustic performance(s) of the acoustic wave device or another acoustic wave device or structure, such as a filter, comprising the acoustic wave device. For example, the shape of the support member(s) (102) may be determined in a way to prevent a resonance from occurring within a frequency band of interest, such as passband frequencies of a filter in which the acoustic wave device is included. In such implementations, cross-sections of the support member(s) (102) may be approximately a circular, oval, or convex polygon shape.

Optionally, the dimensions of the support members(s) (102) may be determined in a way to reduce one or more acoustic wave(s) from the resonator structure of the first type (110) from propagating into the substrate. This may be achieved by reducing cross-sectional area(s) of at least a portion of the support members(s) (102). However, reducing cross-sectional area(s) of the support members(s) (102) may result in reduced level of structural support for the resonator structure of the first type (110). In such implementations, the cross-sectional area(s) may be reduced up to a level that the support members(s) (102) and/or the substrate (100) having the second thickness, $T_2$, can still provide sufficient support to the resonator structure of the first type (110) to prevent structural damage.

As shown in FIG. 2B, the resonator structure of the first type (110) may comprise at least one additional layer (118) formed thereon. The additional layer (118) of the example shown in FIG. 2B is formed on a side of the first electrode (116) that is facing away from the substrate (110). However, in other embodiments, the additional layer (118) may be formed on any side(s) of one or more of the first electrode (116) and second electrode (112). Such additional layer(s) (118) may lower a resonant frequency of the acoustic wave device as discussed above. Optionally, the additional layer (118) may be configured to be used as a loading layer to support one or more component(s).

The resonator structure of the first type (110) may comprise one or more openings (104). Although the opening (104) shown in FIGS. 2A and FIG. 2B is positioned in a central portion of the resonator structure of the first type (110) this is not a requirement and, in other embodiments, one or more opening(s) (104) may be positioned away from the central portion.

Figure 2C:
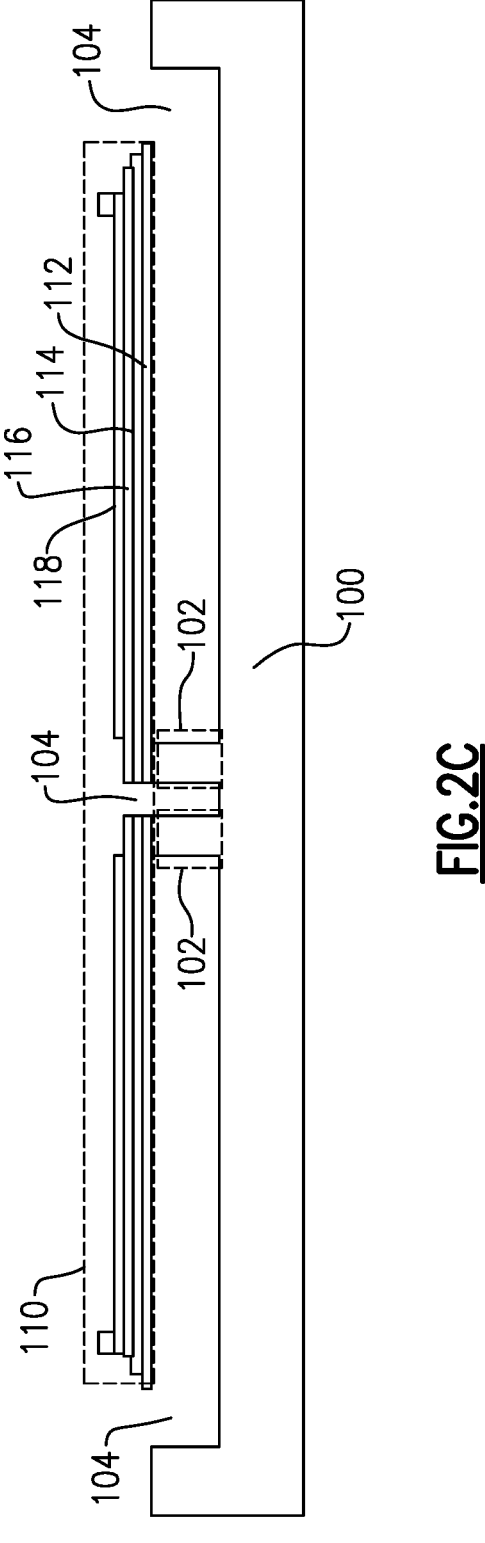
FIG. 2C is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIG. 2C is a cross-sectional view of a section of the acoustic wave device according to the example shown in FIGS. 2A and FIG. 2B, showing a cross-section along a second cross-section line (252). As shown in FIGS. 2A to FIG. 2C, at least a portion of the perimeter of the resonator structure of the first type (110) may not be connected to the portion of the substrate (100) having the second thickness, $T_2$. This may, for example, be because one or more opening(s) (104) may be located on the portion of the substrate (100) having the second thickness, $T_2$, as shown in FIG. 2C.

As shown in FIGS. 2A to FIG. 2C, the electrode (116) having the additional layer (118) formed thereon may not be covered by the additional layer (118) over the portions of the resonator structure of the first type (110) supported by the at least one support member (102). Alternatively, the additional layer (118) formed may have a reduced thickness over the portions of the resonator structure of the first type (110) supported by the at least one support member (102).

Figure 2D:
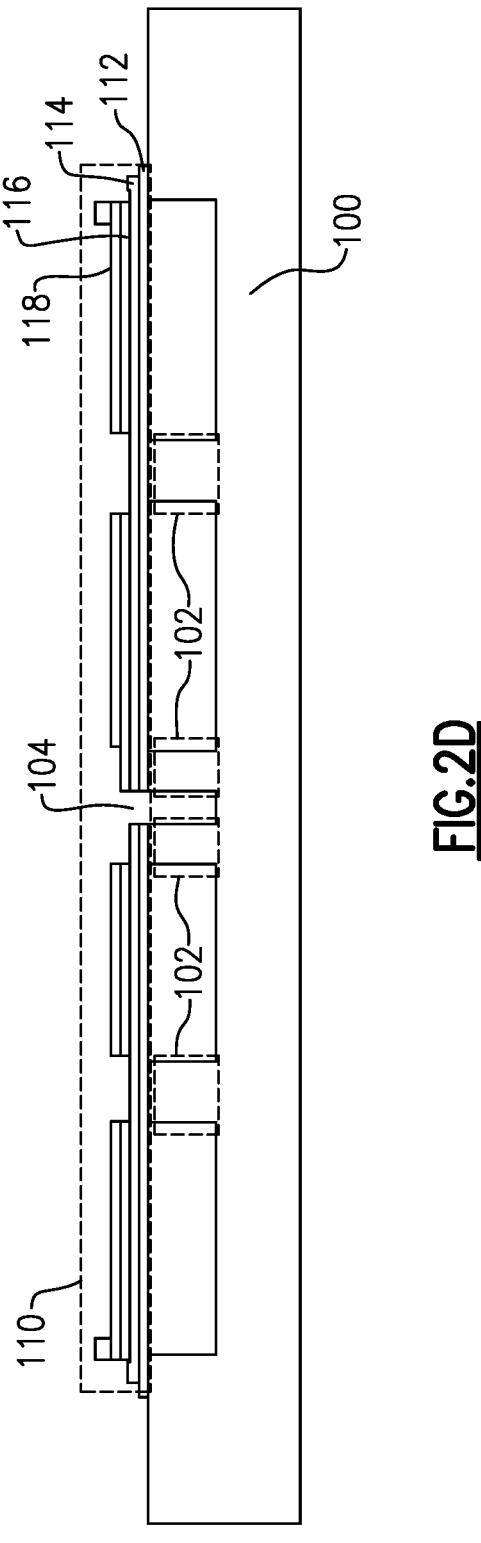
FIG. 2D is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, with portion(s) of the piezoelectric layer overlapping with the support member(s) being uncovered by the first electrode, according to an embodiment.

Similarly, the piezoelectric layer (114) may not be covered by the first and/or second electrode(s) (116, 112) over the portions of the resonator structure of the first type (110) supported by the at least one support member (102). Alternatively, the first and/or second electrode(s) (116, 112) may have a reduced thickness over the portions of the resonator structure of the first type (110) supported by the at least one support member (102). FIG. 2D shows an example having the piezoelectric layer (114) that is not covered by the first electrode (116) or the additional layer (118) over the portions supported by the at least one support member (102). Such configurations may prevent or reduce one or more acoustic wave(s) from the piezoelectric layer (114) from propagating into the substrate by preventing such acoustic wave(s) from being reflected toward the substrate (100) by the additional layer (118) and/or first electrode (116).

The acoustic wave device may comprise at least one frame structure (120) (See FIG. 12B). Such frame structure(s) may comprise one or more of: metal, silicon dioxide ($SiO_2$), silicon nitride (SiN), and/or silicon carbide (SiC). As shown in FIGS. 2A to FIG. 2D, the frame structure (120) may be disposed along an edge of the resonator structure of the first type (110). However, frame structure(s) (120) may also be disposed between one or more of the support members (102) and the resonator structure of the first type (110), and/or between the substrate (100) and the resonator structure of the first type (110).

Figure 3A:
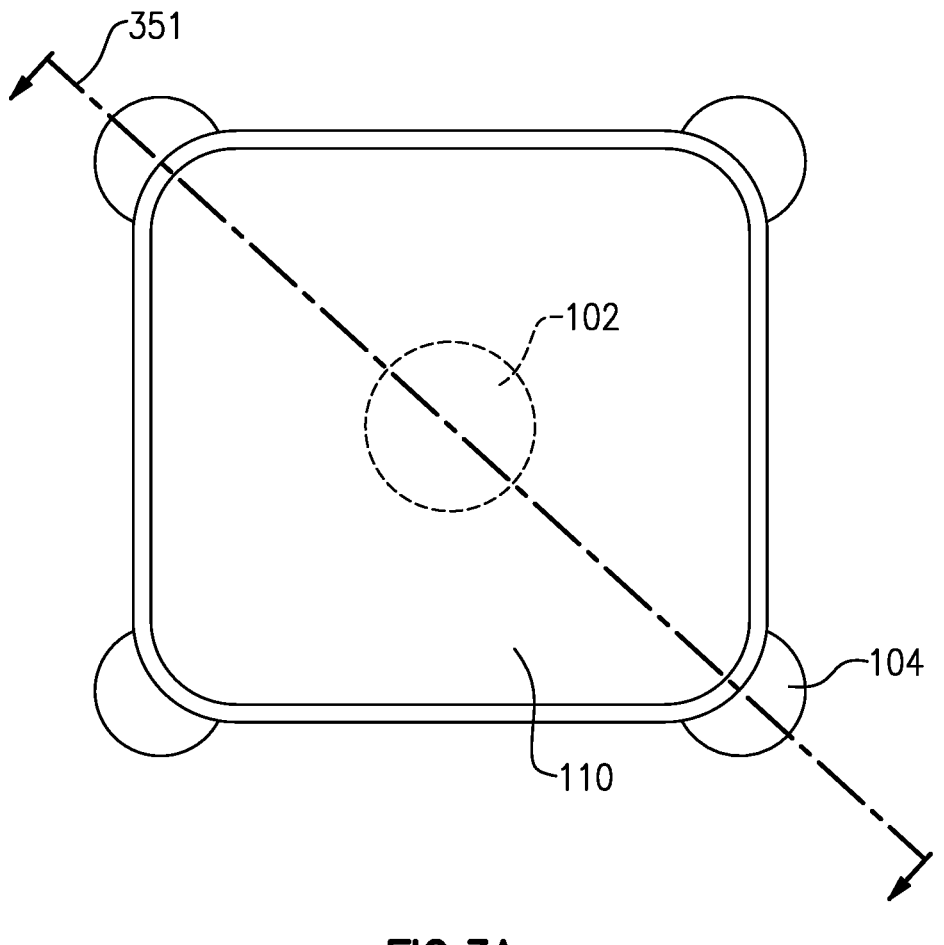
FIG. 3A is a top view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.
Figure 3B:
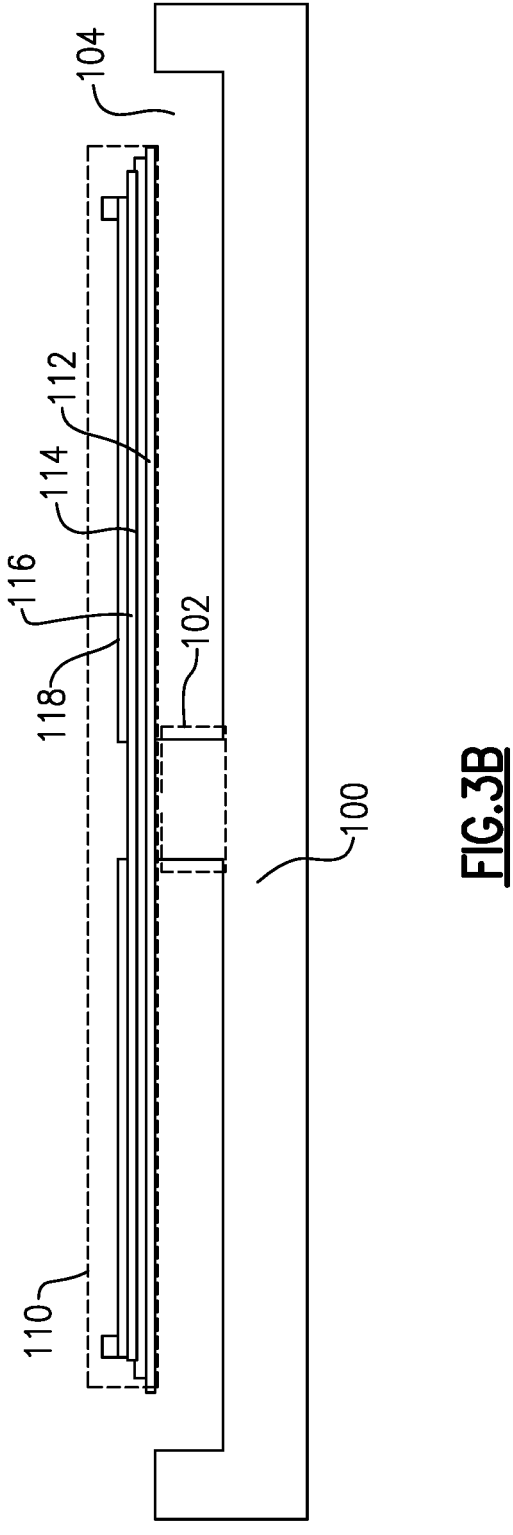
FIG. 3B is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIGS. 3A and FIG. 3B are top and cross-sectional views, respectively, of a section of an acoustic wave device comprising a substrate (100), a resonator structure of the first type (110), an air cavity, and at least one support member (102) according to another embodiment. At least one of the support member(s) (102) may be located between the substrate (100) and the resonator structure of the first type (110). The section of the acoustic wave device in FIGS. 3A and FIG. 3B is similar to the section of the acoustic wave device of FIGS. 2A to FIG. 2D, except that, in the example shown in FIGS. 3A and FIG. 3B, the resonator structure of the first type (110) is in an approximately square form, the resonator structure of the first type (110) is supported by only one support member (102), and the support member (102) or pillar is in an approximately circular cylinder form.

Figure 4A:
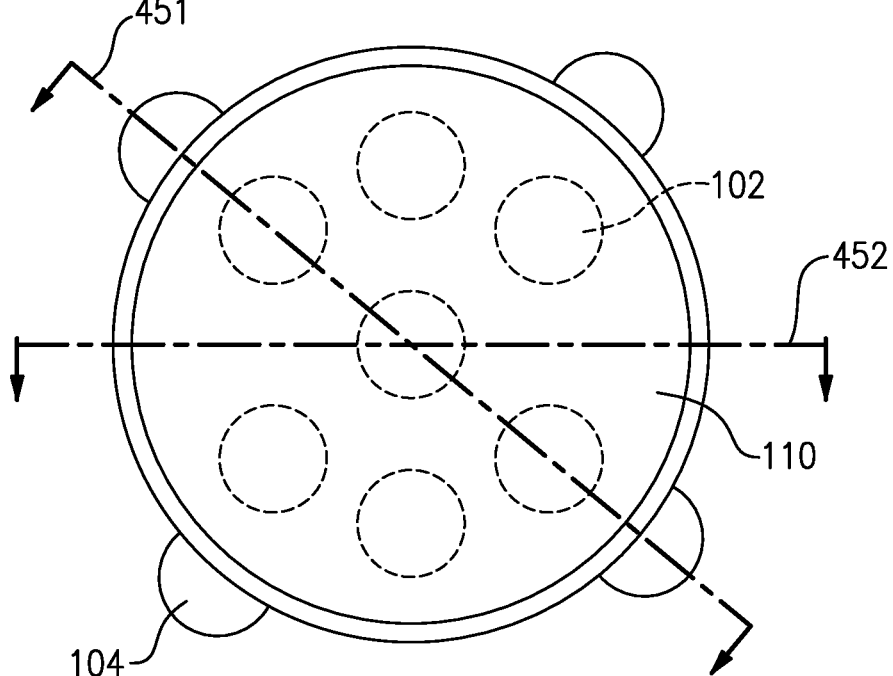
FIG. 4A is a top view of a section of an acoustic wave device comprising a substrate, a resonator structure of a first type configured to operate as a capacitor having a piezoelectric layer between a first electrode and a second electrode, an air cavity between the substrate and the resonator structure of a first type, and at least one support member located in the air cavity supporting the resonator structure of a first type, according to an embodiment.
Figure 4B:
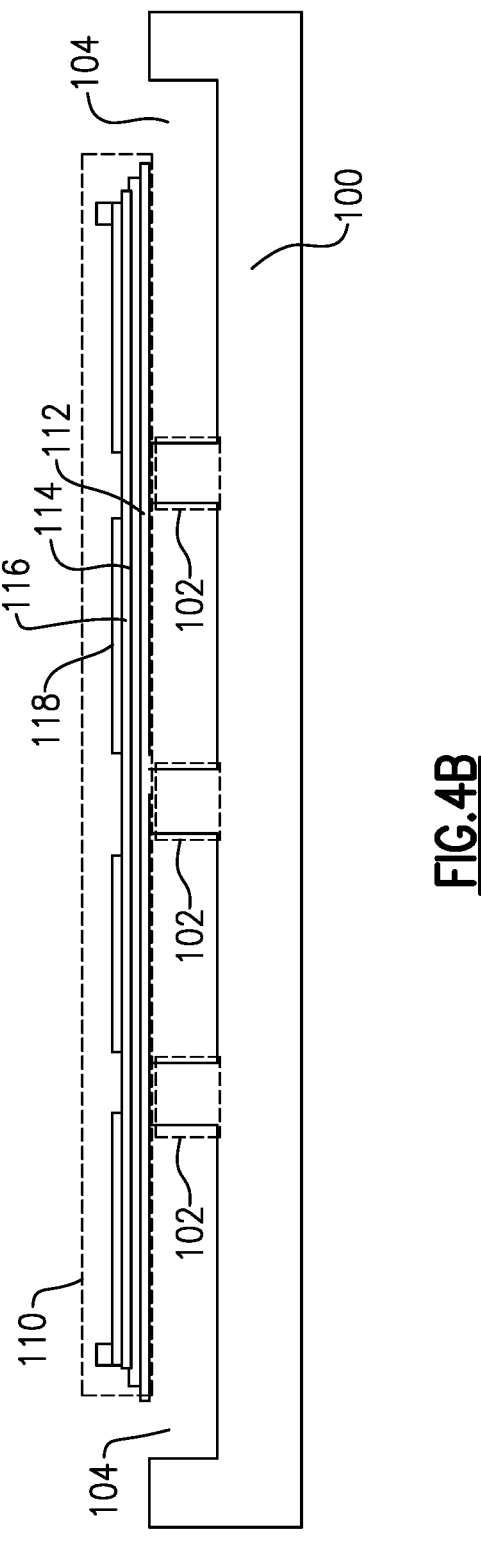
FIG. 4B is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.
Figure 4C:
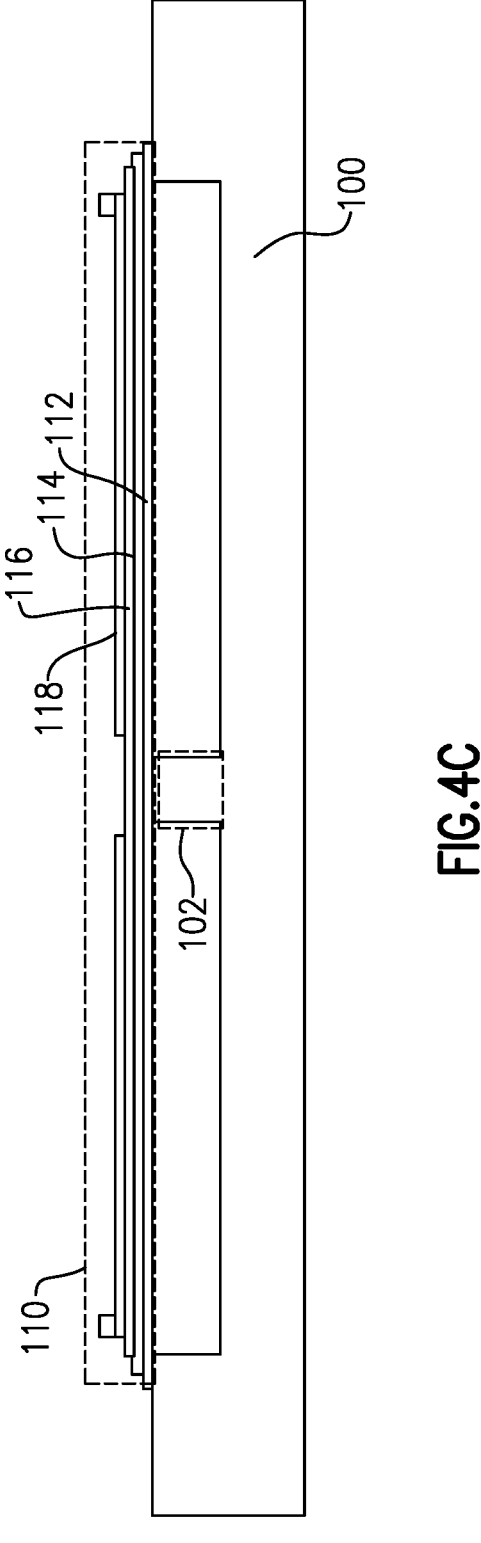
FIG. 4C is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIGS. 4A to FIG. 4C are top and cross-sections views of a section of an acoustic wave device comprising a substrate (100), a resonator structure of the first type (110), an air cavity, and at least one support member (102) according to another embodiment. At least one of the support member(s) (102) may be located between the substrate (100) and the resonator structure of the first type (110). The section of the acoustic wave device in FIGS. 4A to FIG. 4C is similar to the section of the acoustic wave device of FIGS. 2A to FIG. 2D, except that, in the example shown in FIGS. 4A to FIG. 4C, the support members (102) are in an approximately circular cylinder form.

Figure 5A:
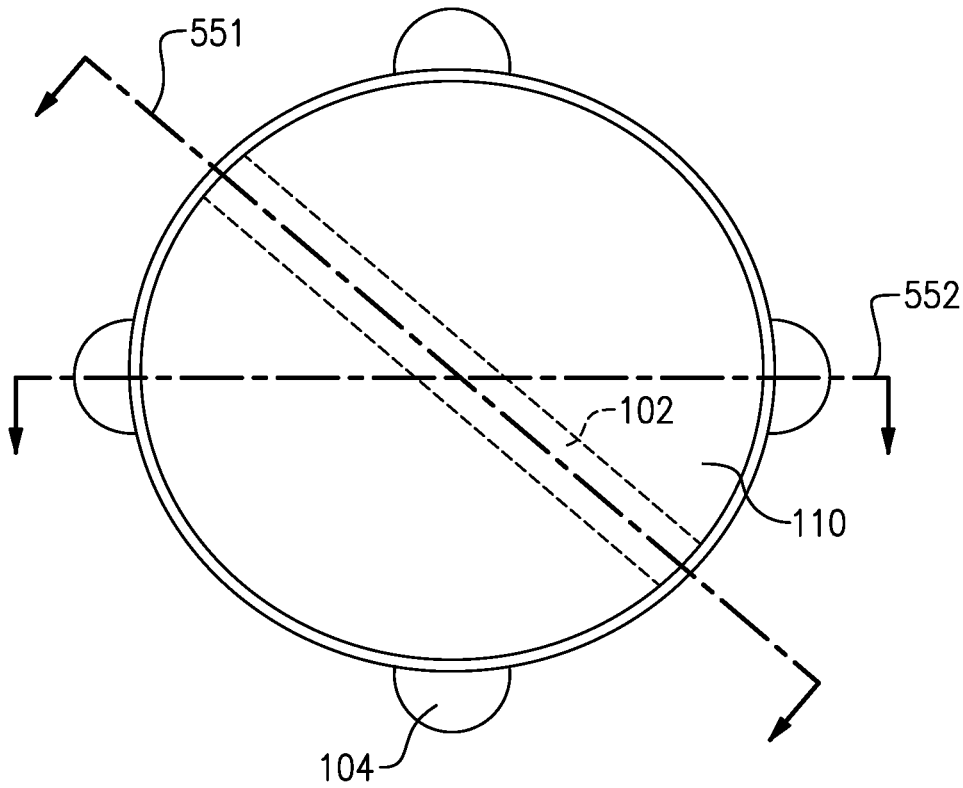
FIG. 5A is a top view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.
Figure 5B:
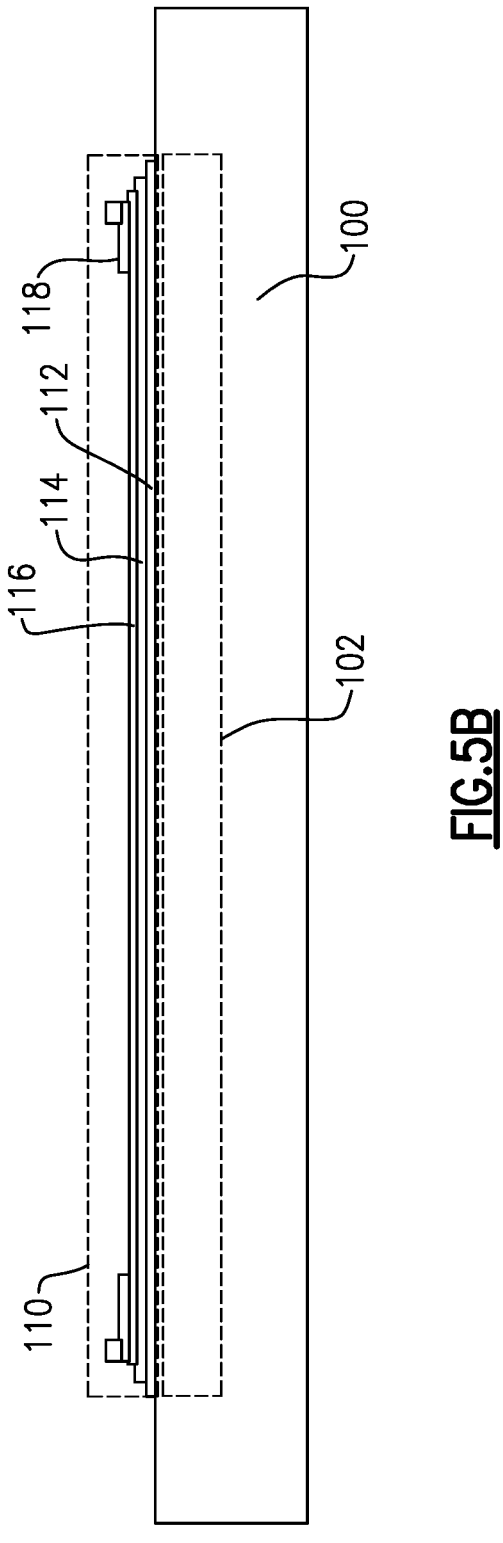
FIG. 5B is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.
Figure 5C:
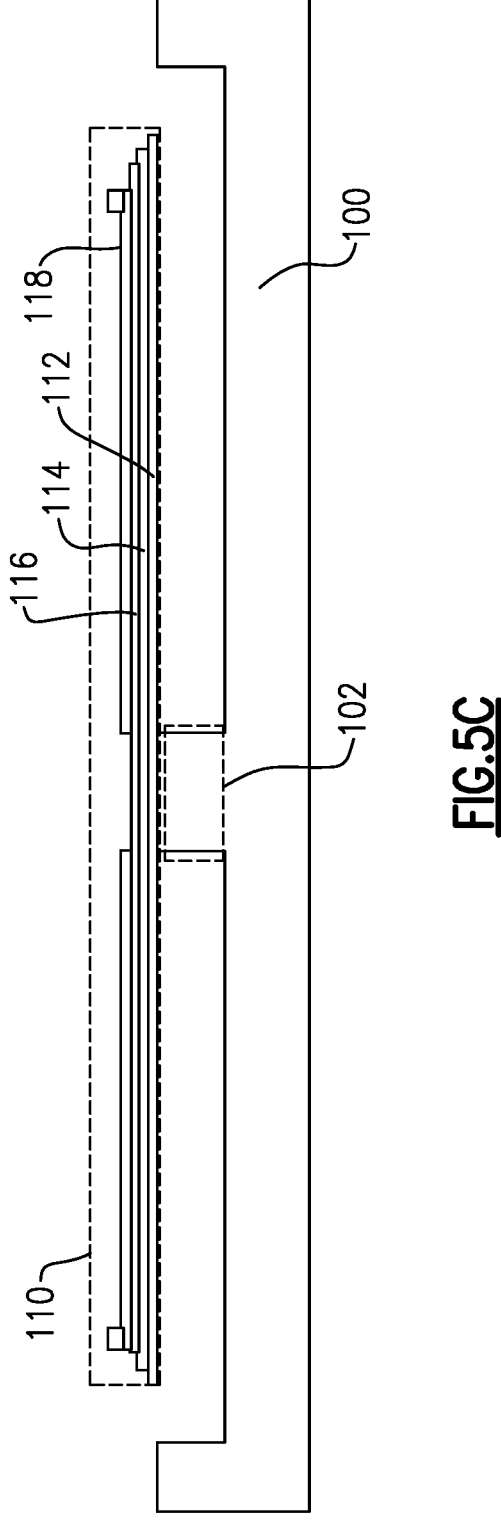
FIG. 5C is a cross-sectional view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIG. 5A is a top view of a section of an acoustic wave device comprising a substrate (100), a resonator structure of the first type (110), an air cavity, and at least one support member (102) according to another embodiment. FIGS. 5B and FIG. 5C show corresponding cross-sectional views of the section of the acoustic wave device shown in FIG. 5A along first and second cross-section lines (551, 552). At least one of the support member(s) (102) may be located between the substrate (100) and the resonator structure of the first type (110). The section of the acoustic wave device in FIGS. 5A, FIG. 5B and FIG. 5C is similar to the section of the acoustic wave device of FIGS. 2A to FIG. 2D, except that, in the example shown in FIGS. 5A to FIG. 5C, the resonator structure of the first type (110) is supported by only one support member (102), and the support member (102) is in an approximately elongated cuboid form crossing the center of the air cavity and extending the entire diameter of the air cavity.

Figure 6:
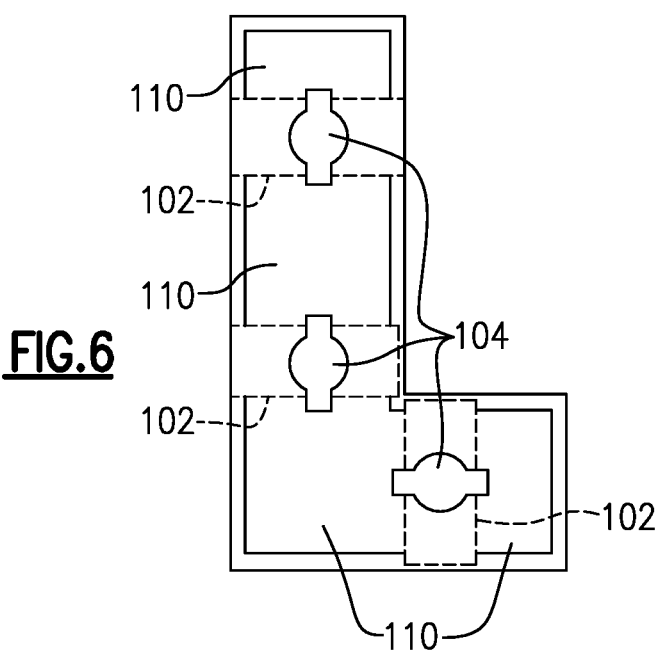
FIG. 6 is a top view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.
Figure 7:
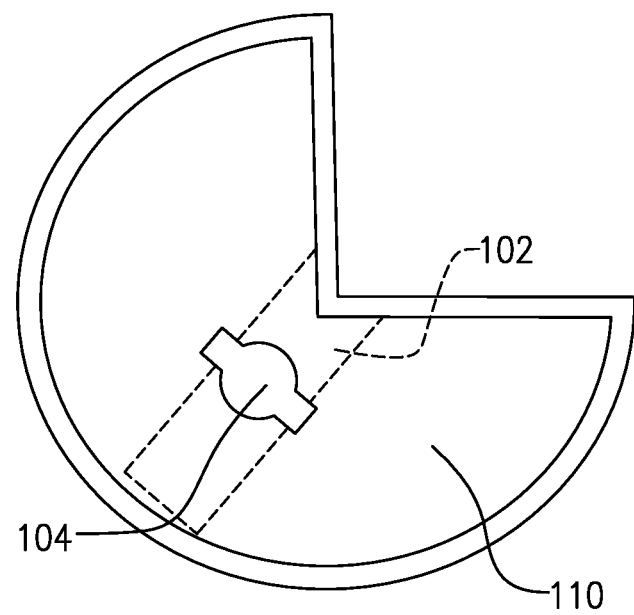
FIG. 7 is a top view of a section of an acoustic wave device comprising a substrate, a resonator structure of a first type configured to operate as a capacitor having a piezoelectric layer between a first electrode and a second electrode, an air cavity between the substrate and the resonator structure of the first type, and at least one support member located in the air cavity supporting the resonator structure of the first type, according to an embodiment.

FIG. 6 and FIG. 7 are top views of RESCAP sections of two acoustic wave devices, each of the acoustic wave devices comprising a substrate (100), a resonator structure of the first type (110), an air cavity, and at least one support member (102) according to another embodiment. At least one of the support member(s) (102), of each of the section of the acoustic wave devices shown in FIGS. 6 and FIG. 7 may be located between the substrate (100) and the resonator structure of the first type (110). The section of the acoustic wave devices in FIGS. 6 and FIG. 7 illustrate two examples of embodiments comprising a resonator structure of the first type (110) having a free-form shape. In such implementations, the air cavity and/or the portion of the substrate (100) having the second thickness, $T_2$, may have a similar shape(s) as that of the resonator structure of the first type (110). This may enable at least a portion of an edge of the resonator structure of the first type (110) to be supported by the second thickness, $T_2$. Alternatively, the resonator structure of the first type (110) may be entirely supported by the support member(s) (102).

Figure 8:
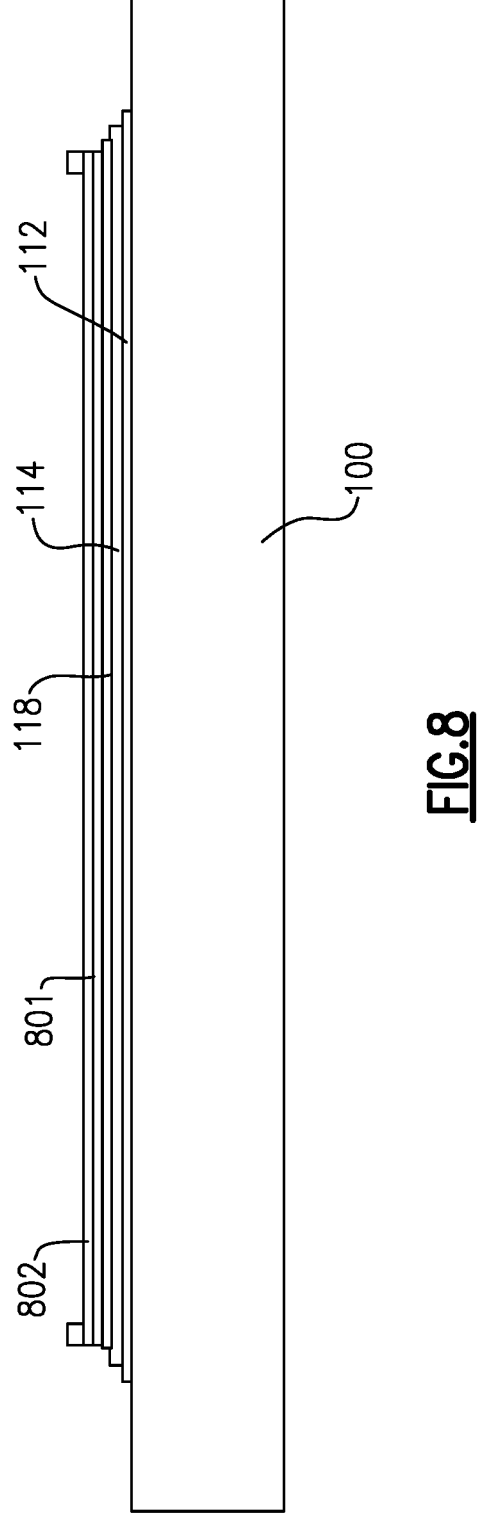
FIG. 8 is a cross-sectional view of a section of an acoustic wave device comprising a substrate, and a resonator structure of a first type configured to operate as a capacitor having a piezoelectric layer between a first electrode and a second electrode, according to an embodiment.

FIG. 8 is a cross-sectional view of an acoustic wave device comprising a substrate (100) and a resonator structure of the first type (110). The substrate (100) supports the resonator structure of the first type over substantially the entire area of the resonator structure of the first type (110). The second electrode is located between the piezoelectric layer (114) and the substrate (100). The section of the acoustic wave device in FIG. 8 is similar to the section of the acoustic wave device of FIG. 1, except that the resonator structure of the first type (110) of the example shown in FIG. 8 does not comprise an air cavity between the substrate (100) and the resonator structure of the first type (110). Therefore, the example shown in FIG. 8 also does not comprise a support member which would be typically located within the air cavity.

If the acoustic wave device does not comprise an air cavity between the substrate (100) and the resonator structure of the first type (110), as shown in the example of FIG. 8, preventing or reducing reduce wave propagation from the resonator structure of the first type (110) into the substrate and/or other structures attached to the substrate by physically separating the substrate (100) and the resonator structure of the first type (110) may be difficult. In such implementations, the resonant frequency of the resonator structure of the first type (110) may be further shifted away from the passband frequencies of the other acoustic wave device or structure. Such further shifting of the resonant frequency may be achieved by introducing a plurality of additional layers (118, 801, 802) on at least one of the first and second electrodes (112, 116). Two or more of the plurality of additional layers (118, 801, 802) may comprise the same material(s).

Figure 9:
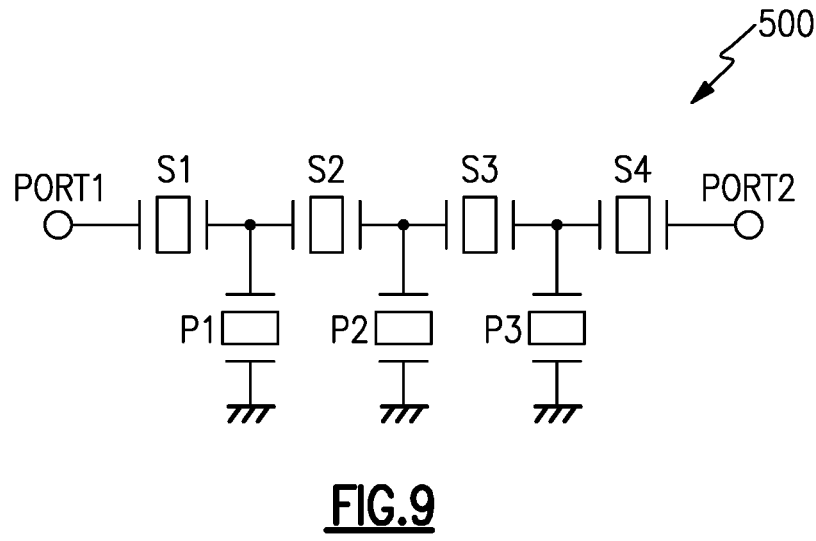
FIG. 9 illustrates a circuit diagram of a filter according to aspects of the present invention.

FIG. 9 is a filter (500) according to aspects of the present invention. The filter (500) comprises a plurality of BAW resonators, and at least one of the acoustic device such as those of FIGS. 1 to FIG. 8. The filter (500) is a passband or ladder filter, though it will be appreciated that the BAW resonators described herein can be included in other types of filter.

The ladder filter (500) includes a plurality of series resonators S1, S2, S3, and S4 coupled in series between an input port, PORT1, and an output port, PORT2. The filter (500) also includes a plurality of parallel resonators P1, P2, and P3 connected between terminals of the series resonators and ground. Whilst four series resonators S1, S2, S3, S4 and three parallel resonators P1, P2, P3 are shown, it will be appreciated that more or fewer series and/or parallel resonators may be used.

Figure 10:
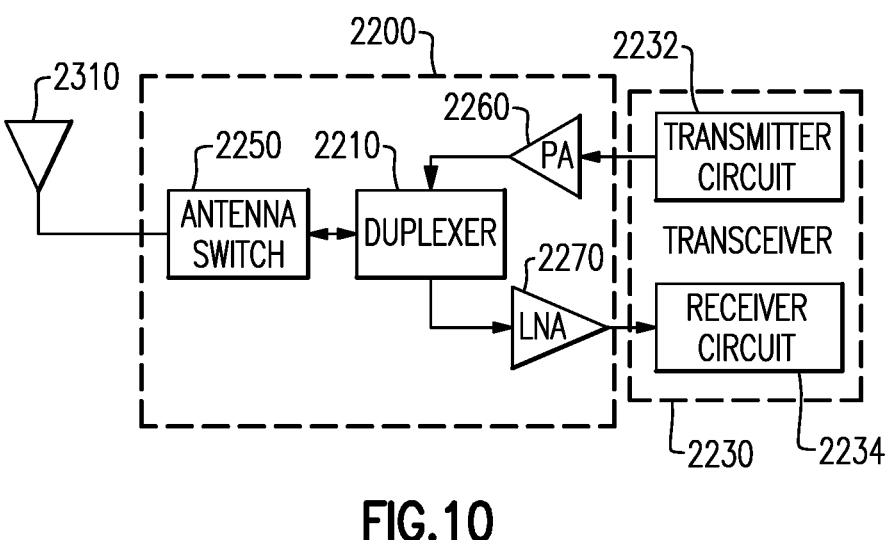
FIG. 10 illustrates a circuit diagram radio-frequency front end module according to aspects of the present invention.

The filter (500) of FIG. 9, or the acoustic device such as those of FIGS. 1 to FIG. 8, may also be included in a radio-frequency front end (RFFE) module. An exemplary RFFE module is shown in FIG. 10. This figure illustrates a front end module (2200), connected between an antenna (2310) and a transceiver (2230). The front end module (2200) includes a duplexer (2210) in communication with an antenna switch (2250), which itself is in communication with the antenna (2310).

As illustrated, the transceiver (2230) comprises a transmitter circuit (2232). Signals generated for transmission by the transmitter circuit (2232) are received by a power amplifier (PA) module (2260) within the front end module (2200) which amplifies the generated signals from the transceiver (2230). The PA module (2260) can include one or more PAs. The PA module (2260) can be used to amplify a wide variety of RF or other frequency-band transmission signals. For example, the PA module (2260) can receive an enable signal that can be used to pulse the output of the PA to aid in transmitting a wireless local area network (WLAN) signal or any other suitable pulsed signal. The PA module (2260) can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the PA module (2260) and associated components including switches and the like can be fabricated on gallium arsenide (GaAs) substrates using, for example, high electron mobility transistors (pHEMT) or insulated-gate bipolar transistors (BiFET), or on a silicon substrate using complementary metal-oxide semiconductor (CMOS) field effect transistors (FETs).

Still referring to FIG. 10, the front end module (2200) may further include a low noise amplifier (LNA) module (2270), which amplifies received signals from the antenna (2310) and provides the amplified signals to the receiver circuit (2234) of the transceiver (2230).

Figure 11:
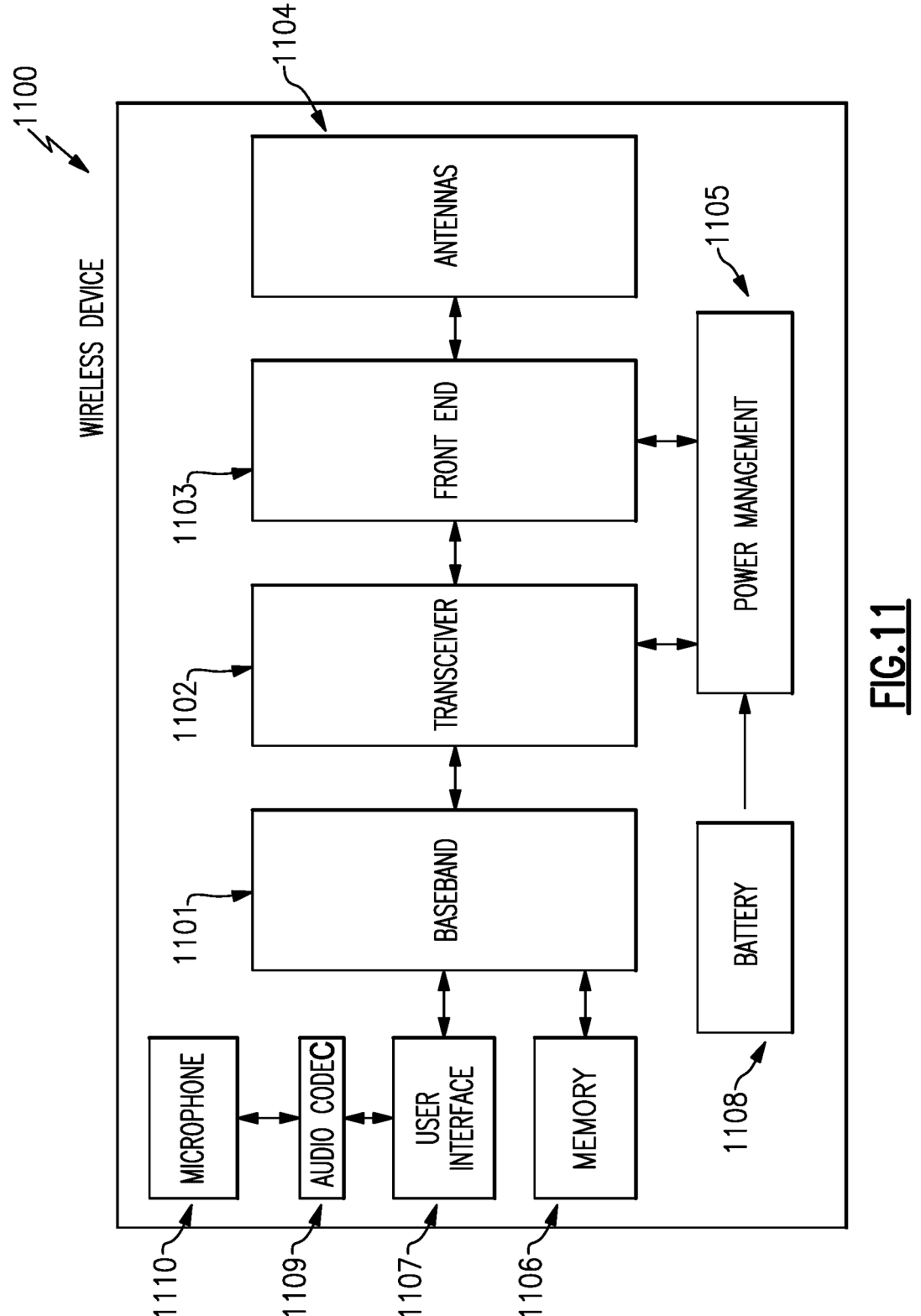
FIG. 11 illustrates a circuit diagram of a wireless device according to aspects of the present invention.

FIG. 11 is a schematic diagram of a wireless device (1100) that can incorporate aspects of the invention. The wireless device (1100) can be, for example but not limited to, a portable telecommunication device such as a mobile cellular-type telephone. The wireless device (1100) can include a microphone arrangement (1110) and may include one or more of a baseband system (1101), a transceiver (1102), a front end system (1103) (such as the front end module (2200) of FIG. 10), one or more antennas (1104), a power management system (1105), a memory (1106), a user interface (1107), a battery (1108), and audio codec (1109). The microphone arrangement may supply signals to the audio codec (1109) which may encode analog audio as digital signals or decode digital signals to analog. The audio codec (1109) may transmit the signals to a user interface (1107). The user interface (1107) transmits signals to the baseband system (1101). The transceiver (1102) generates RF signals for transmission and processes incoming RF signals received from the antennas. The front end system (1103) aids in conditioning signals transmitted to and/or received from the antennas (1104). The antennas (1104) can include antennas used for a wide variety of types of communications. For example, the antennas (1104) can include antennas (1104) for transmitting and/or receiving signals associated with a wide variety of frequencies and communications standards. The baseband system (1101) is coupled to the user interface to facilitate processing of various user input and output, such as voice and data. The baseband system (1101) provides the transceiver (1102) with digital representations of transmit signals, which the transceiver (1102) processes to generate RF signals for transmission. The baseband system (1101) also processes digital representations of received signals provided by the transceiver (1102).

As shown in FIG. 11, the baseband system (1101) is coupled to the memory (1106) to facilitate operation of the wireless device (1100). The memory (1106) can be used for a wide variety of purposes, such as storing data and/or instructions to facilitate the operation of the wireless device (1100) and/or to provide storage of user information. The power management system (1105) provides a number of power management functions of the wireless device (1100). The power management system (1105) receives a battery voltage from the battery (1108). The battery (1108) can be any suitable battery for use in the wireless device, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An acoustic wave device comprising:
   a substrate; and
   at least one resonator structure of a first type and at least one resonator structure of a second type mounted on the substrate, each of the resonator structures of the first and second types including a first electrode, a second electrode, and a piezoelectric layer, the piezoelectric layer being located between the first electrode and the second electrode, the second electrode being located between the piezoelectric layer and the substrate, the resonator structures of the first type being configured to operate as capacitors and having a first thickness, causing the resonator structures of the first type to have a first passband frequency range between a first resonant frequency, $f_{s1}$, and a first anti-resonant frequency, $f_{p1}$, and the resonator structures of the second type having a second thickness that is different from the first thickness, causing the resonator structures of the second type to have a second passband frequency range between a second resonant frequency, $f_{s2}$, and a second anti-resonant frequency, $f_{p2}$.

2. The acoustic wave device of claim 1 wherein the first and second passband frequency ranges are non-overlapping with each other.

3. The acoustic wave device of claim 1 wherein one of the first electrodes of the resonator structures of the first type and the first electrodes of the resonator structures of the second type have different thicknesses or the second electrodes of the resonator structures of the first type and the second electrodes of the resonator structures of the second type have different thicknesses.

4. The acoustic wave device of claim 1 wherein the first anti-resonant frequency, $f_{p1}$ is smaller than the second resonant frequency, $f_{s2}$.

5. The acoustic wave device of claim 4 wherein the first anti-resonant frequency, $f_{p1}$ and the second resonant frequency, $f_{s2}$, are separated by an amount such that at least one resonance originating from the resonator structures of the first type is minimized in the second passband frequency.

6. The acoustic wave device of claim 4 wherein the first anti-resonant frequency, $f_{p1}$ and the second resonant frequency, $f_{s2}$, are separated by one of at least $f_{p1}$-$f_{s1}$ or at least $f_{p2}$-$f_{s2}$.

7. The acoustic wave device of claim 1 further comprising an air cavity located between the substrate and each of the resonator structures of the first type, and at least one support member supporting each of the resonator structures of the first type, the support members being located in the air cavities.

8. The acoustic wave device of claim 7 wherein the substrate has a portion having a first thickness, $T_1$, and a portion having a second thickness, $T_2$, the second thickness being greater than the first thickness, to define the air cavity, at least one of the support members being located on the portion of the substrate having the first thickness, $T_1$.

9. The acoustic wave device of claim 8 wherein the second thickness, $T_2$, of the substrate is equal to $T_2=T_1+T_s$, $T_s$ being a height of one of the support members.

10. The acoustic wave device of claim 8 wherein at least a portion of at least one of the resonator structures of the first type is supported by the portion of the substrate having the second thickness, $T_2$.

11. The acoustic wave device of claim 7 wherein at least one of the support members is located entirely within the air cavity.

12. The acoustic wave device of claim 7 wherein at least one of the support members is approximately in a form of one of a cuboid, a cube, a cylinder, an elliptic cylinder, a prism, or a ring.

13. The acoustic wave device of claim 7 wherein the first and/or second electrode of at least one of the resonator structures of the first type has a reduced thickness over portions of the resonator structures of the first type supported by the at least one support member.

14. The acoustic wave device of claim 7 wherein the piezoelectric layer of at least one of the resonator structures of the first type is not covered by the first and/or second electrode(s) over portions of the resonator structures of the first type supported by the at least one support member.

15. The acoustic wave device of claim 7 wherein at least one of the resonator structures of the first type includes at least one frame structure having at least one frame disposed along an edge of at least one of the resonator structures of the first type.

16. The acoustic wave device of claim 7 wherein at least one of the resonator structures of the first type includes at least one frame structure having at least one frame disposed between one or more of the support members and at least one of the resonator structures of the first type.

17. The acoustic wave device of claim 1 wherein each of the first and/or second electrodes of at least one of the resonator structures of the first type includes a first metal layer and at least one additional metal layer adjacent to the first metal layer, thereby lowering a resonant frequency of the acoustic wave device.

18. The acoustic wave device of claim 1 wherein the acoustic wave device is a bulk acoustic wave (BAW) device.

19. A filter including one or more acoustic wave devices, each acoustic wave device comprising:

a substrate; and at least one resonator structure of a first type and at least one resonator structure of a second type mounted on the substrate, each of the resonator structures of the first and second types including a first electrode, a second electrode, and a piezoelectric layer, the piezoelectric layer being located between the first electrode and the second electrode, and the second electrode being located between the piezoelectric layer and the substrate, the resonator structures of the first type being configured to operate as capacitors and having a first thickness causing the resonator structures of the first type to have a first passband frequency range between a first resonant frequency, $f_{s1}$, and a first anti-resonant frequency, $f_{p1}$, and the resonator structures of the second type having a second thickness that is different from the first thickness, causing the resonator structures of the second type to have a second passband frequency range between a second resonant frequency, $f_{s2}$, and a second anti-resonant frequency, $f_{p2}$.

20. A radio-frequency module including a packaging substrate configured to receive a plurality of devices and a die mounted on the packaging substrate, the die including an acoustic wave device, the acoustic wave device comprising:

a substrate; and at least one resonator structure of a first type and at least one resonator structure of a second type mounted on the substrate, each of the resonator structures of the first and second types having a first electrode, a second electrode, and a piezoelectric layer, the piezoelectric layer being located between the first electrode and the second electrode, and the second electrode being located between the piezoelectric layer and the substrate, the resonator structures of the first type being configured to operate as capacitors and having a first thickness causing the resonator structures of the first type to have a first passband frequency range between a first resonant frequency, $f_{s1}$, and a first anti-resonant frequency, $f_{p1}$, and the resonator structures of the second type having a second thickness that is different from the first thickness, causing the resonator structures of the second type to have a second passband frequency range between a second resonant frequency, $f_{s2}$, and a second anti-resonant frequency, $f_{p2}$.

* * * * *